United States Patent [19]
Yahagi et al.

[11] Patent Number: 5,389,899
[45] Date of Patent: Feb. 14, 1995

[54] FREQUENCY SYNTHESIZER HAVING QUICK FREQUENCY PULL IN AND PHASE LOCK-IN

[75] Inventors: Shinya Yahagi; Noriyoshi Komatsu, both of Sendai; Toshimitsu Kibayashi; Yoshifumi Toda, both of Kawasaki, all of Japan

[73] Assignee: Fujitsu Limited, Japan

[21] Appl. No.: 50,151

[22] PCT Filed: Aug. 27, 1992

[86] PCT No.: PCT/JP92/01086
§ 371 Date: Apr. 23, 1993
§ 102(e) Date: Apr. 23, 1993

[87] PCT Pub. No.: WO93/05578
PCT Pub. Date: Mar. 18, 1993

[30] Foreign Application Priority Data
Aug. 30, 1991 [JP] Japan ................... 3-220543

[51] Int. Cl.$^6$ .................. H03L 7/18; H03L 7/10
[52] U.S. Cl. ...................... 331/10; 331/14; 331/16; 331/17; 331/25; 331/176
[58] Field of Search ............ 331/10, 14, 16, 17, 331/25, 176

[56] References Cited

U.S. PATENT DOCUMENTS

| | | | |
|---|---|---|---|
| 4,562,410 | 12/1985 | O'Rourke | 331/25 X |
| 4,980,652 | 12/1990 | Tarusawa et al. | 331/16 X |
| 5,047,733 | 9/1991 | Nonaka et al. | 331/14 |

FOREIGN PATENT DOCUMENTS 57-162527 10/1982 Japan .
62-139138 9/1987 Japan .
63-35017 2/1988 Japan .

Primary Examiner—Siegfried H. Grimm
Attorney, Agent, or Firm—Greer, Burns & Crain, Ltd.

[57] ABSTRACT

A frequency synthesizer, including a phase-locked loop. The phase locked loop effects phase comparison between a comparison signal based on an output from a voltage-controlled oscillator and a reference signal based on an output from a reference oscillator. The resultant phase difference signal is submitted to a loop filter whose output serves as a control signal of the voltage-controlled oscillator. The frequency synthesizer includes a preset circuit for switching the output of the voltage-controlled oscillator by quickly charging or discharging a capacitor of the loop filter and a modifying circuit for modifying the time constant of the loop filter. The phase-locked loop is brought to phase lock at a high speed by decreasing the time constant of the loop filter when switching the output frequency.

9 Claims, 9 Drawing Sheets

F I G. 4A
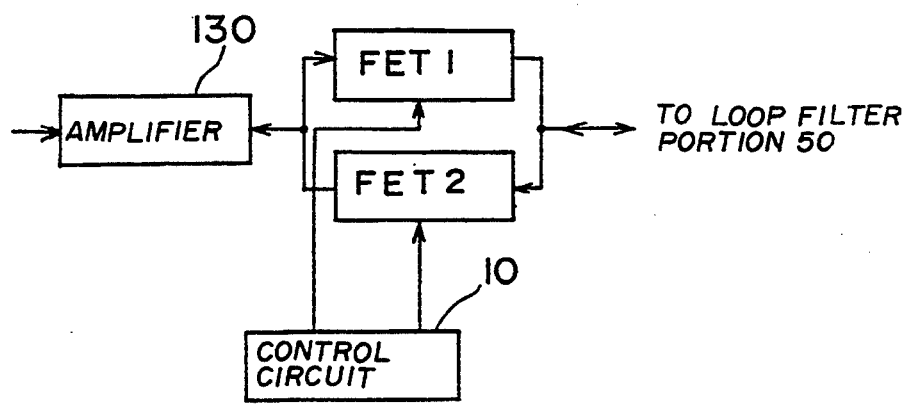
F I G. 4B
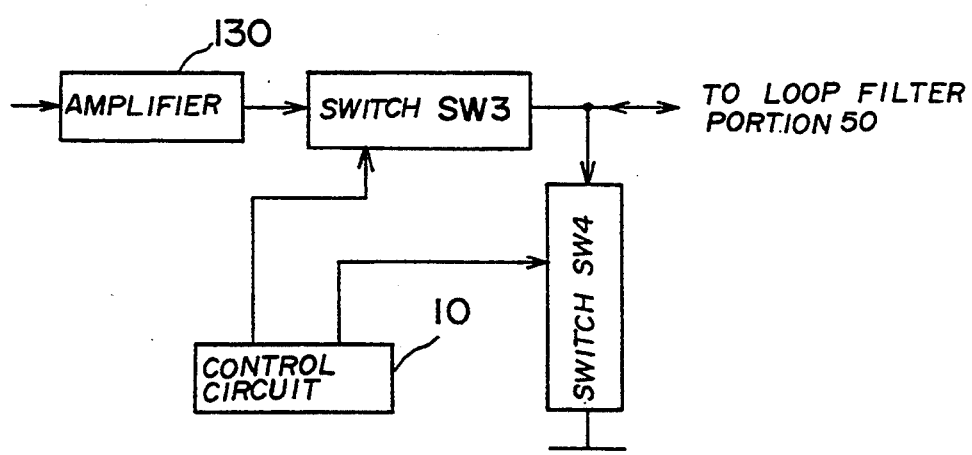

t=0    Pull-in    Lock-in

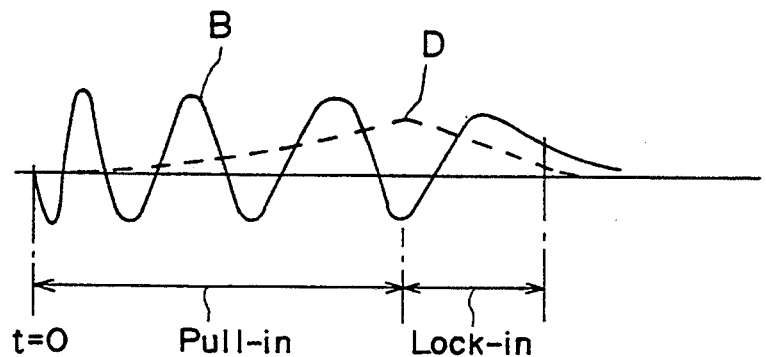
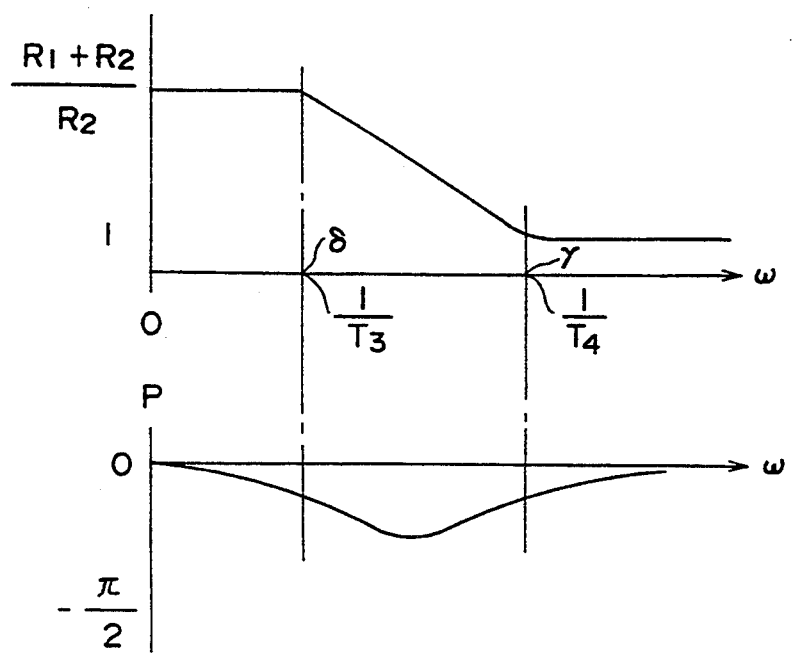

FREQUENCY SYNTHESIZER HAVING QUICK FREQUENCY PULL IN AND PHASE LOCK-IN

FIELD OF THE INVENTION

The present invention relates to a frequency synthesizer, and more particularly to a frequency synthesizer capable of quickly switching output frequencies.

BACKGROUND ART

A general configuration employed nowadays for radio communication equipment such as an automobile telephone or a portable telephone, is one in which communication is switched to a channel specified by a base station when necessary, and therefore a high-speed channel switching performance is required for a synthesizer constituting a local oscillator.

An illustrative configuration of the conventional frequency synthesizer is shown in FIG. 1. This frequency synthesizer is used as a frequency source for an automobile telephone; and this automobile telephone has a battery power saving function when in a stand-by state.

In FIG. 1 indicates a reference oscillator for generating a highly stable reference frequency. Assume, in this example, that this oscillator oscillates at 12.8 MHz. 2 indicates a reference divider for dividing the reference frequency generated by the reference oscillator 1. In this case, the 12.8 MHz signal is divided into a 25 kHz reference signal $f_r$. 3 indicates a phase comparator for performing comparison between a comparison signal $f_v$ from a comparison divider 8 described later and the reference signal $f_r$ from the reference divider 2, then delivering a phase difference signal (a lead signal or a lag signal) to a charge pump 4.

5 indicates a loop filter portion including a low-pass filter composed of resistors 151, 152 and a capacitor 153, the charging and discharging of this capacitor being controlled by the charge pump 4. An output signal from the loop filter portion 5 is fed, as a control voltage, to the input of a voltage-controlled oscillator 7 via a low-pass filter 6. The voltage-controlled oscillator 7 in this example is a circuit oscillating at a variable frequency of about 1.5 GHz; and an oscillation signal output therefrom is drawn as an output signal from the frequency synthesizer, and is fed to the input of the comparison divider 8 via a pre-scaler 70. The pre-scaler 70 is a circuit for dividing the oscillation frequency of about 1.5 GHz from the voltage-controlled oscillator 7 into a frequency of about 10 MHz, for example. The comparison divider 8 is a circuit for dividing the output signal from the pre-scaler 70 into the comparison signal $f_v$ of 25 kHz.

90 indicates a forced phase-locked loop. The forced phase-locked loop 90 is a circuit for effecting control so that the frequency synthesizer may quickly lock itself to a desired frequency when the frequency synthesizer is activated, that is, for example, when the power saving function is switched from ON to OFF. Specifically, the phase-locked loop is a circuit for forcing, by referring to the comparison signal $f_v$ of the comparison divider 8, phase lock-in in the reference divider 2 such that the phase of the reference signal $f_r$ of the reference divider 2 is in step with the phase of the comparison signal $f_v$. Since, normally, the control voltage of the voltage-controlled oscillator 7 is maintained, when the power saving function is ON, at the same level as immediately before the power saving function is turned ON, the frequency of the comparison signal $f_v$ is maintained the same as the frequency of the reference signal $f_r$ even after the power saving function is OFF, but a phase difference is created between $f_r$ and $f_v$. The forced phase-locked loop 90 reduces the time required for pull-in in the frequency synthesizer by forcing this phase difference to be zero.

In the above circuit, a circuit 20 marked off by a double line, that is, the circuit including the reference divider 2, the phase comparator 3, the charge pump 4, the comparison divider 8, and the forced phase-locked loop 90, is normally embodied by a single IC. Such IC circuit 20 is combined with the reference oscillator 1, the loop filter 5, the voltage-controlled oscillator, and the pre-scaler 70, to constitute the frequency synthesizer.

In this frequency synthesizer, the IC circuit 20 is provided with inputs of a clock CLK, data DATA, a strobe signal STB, and a power saving signal PS. The output frequency of the frequency synthesizer is adjusted by changing the dividing ratio of the reference divider 2 and the comparison divider 8 by means of this data DATA.

While it is true that the conventional frequency synthesizer achieves a high-speed frequency pull-in using the above-described forced phase-locked loop when recovering from the power saving mode, it should be noted that the time period, required for the phase-locked loop to frequency-lock or phase-lock with the desired frequency following a frequency switching, is determined by the time constant of the loop filter and the transfer function of each circuit. Since it needs a certain amount of time for the capacitor to be charged or discharged in the loop filter, the frequency switching takes time correspondingly. Therefore, the conventional circuit does not meet the demand for higher speed that is necessary, for example, in the aforementioned automobile telephone.

DISCLOSURE OF THE INVENTION

The present invention is accomplished in view of the above situation, and has as an object the providing of a frequency synthesizer in which the time elapsing from when initiation of an output frequency switching operation is initiated until establishment of the actual phase lock-in is reduced.

The above object of the present invention can be achieved by a frequency synthesizer including a phase-locked loop for conducting, by means of a phase comparator, a phase comparison of a comparison signal based on an output of a voltage-controlled oscillator with a reference signal based on an output of a reference oscillator, and for submitting a phase difference signal derived from the comparison to a loop filter whose output serves as a control signal of the voltage-controlled oscillator, the frequency synthesizer being characterized in that it is equipped with: a preset circuit provided for quickly charging and discharging a capacitor of the loop filter so that the output frequency of the voltage-controlled oscillator may be switched; and a modifying circuit for modifying a time constant of the loop filter, and in that the phase-locked loop is quickly brought into phase lock-in by reducing the time constant of the loop filter when switching the output frequency.

According to the frequency synthesizer of the present invention, the response of the phase-locked loop becomes quicker because, when switching the frequency, the time constant of the loop filter is reduced by the modifying circuit as well as by quickly charging and discharging the capacitor of the loop filter by means of the preset circuit, thereby greatly reducing the time required for frequency pull-in and phase lock-in.

Other objects and further features of the present invention will be apparent from the following detailed description when read in conjunction with the accompanying drawings.

BRIEF DESCRIPTION OF THE DRAWINGS

FIG. 4A and 4B are block diagrams illustrating the configuration of a switch in the frequency synthesizer of FIG. 3;

FIG. 9A and 9B describe the operational characteristics of the frequency synthesizer of a preset type shown in FIG. 8.

BEST MODE OF CARRYING OUT THE INVENTION

Figure 2:
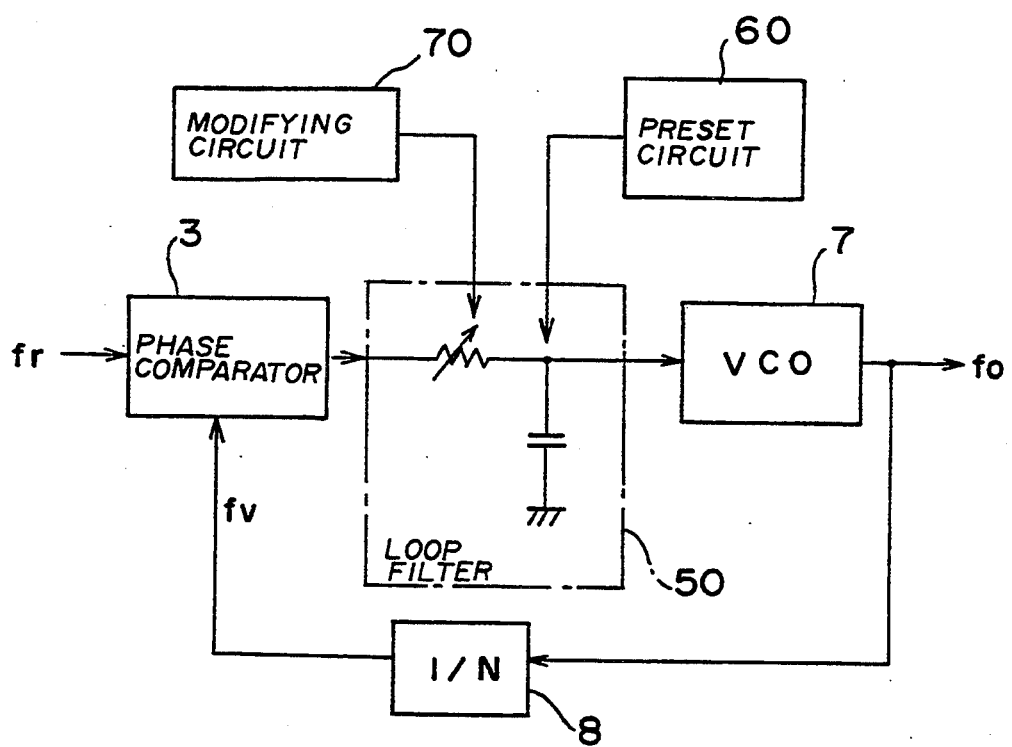
FIG. 2 describes the principle of the present invention.

FIG. 2 describes the principle of the frequency synthesizer according to the present invention. As shown in FIG. 2, the frequency synthesizer of the present invention enables the reducing of the time required for frequency pull-in and phase lock-in, because the oscillating frequency of the voltage-controlled oscillator 7 is quickly switched by charging and discharging a capacitor of a loop filter 50 by means of a preset circuit 60, and because the time constant of the loop filter portion 50 is reduced, by means of the modifying circuit 70 for modifying the time constant of the loop filter 50, when switching the frequency so that the response of a PLL loop may become quicker.

Figure 1:
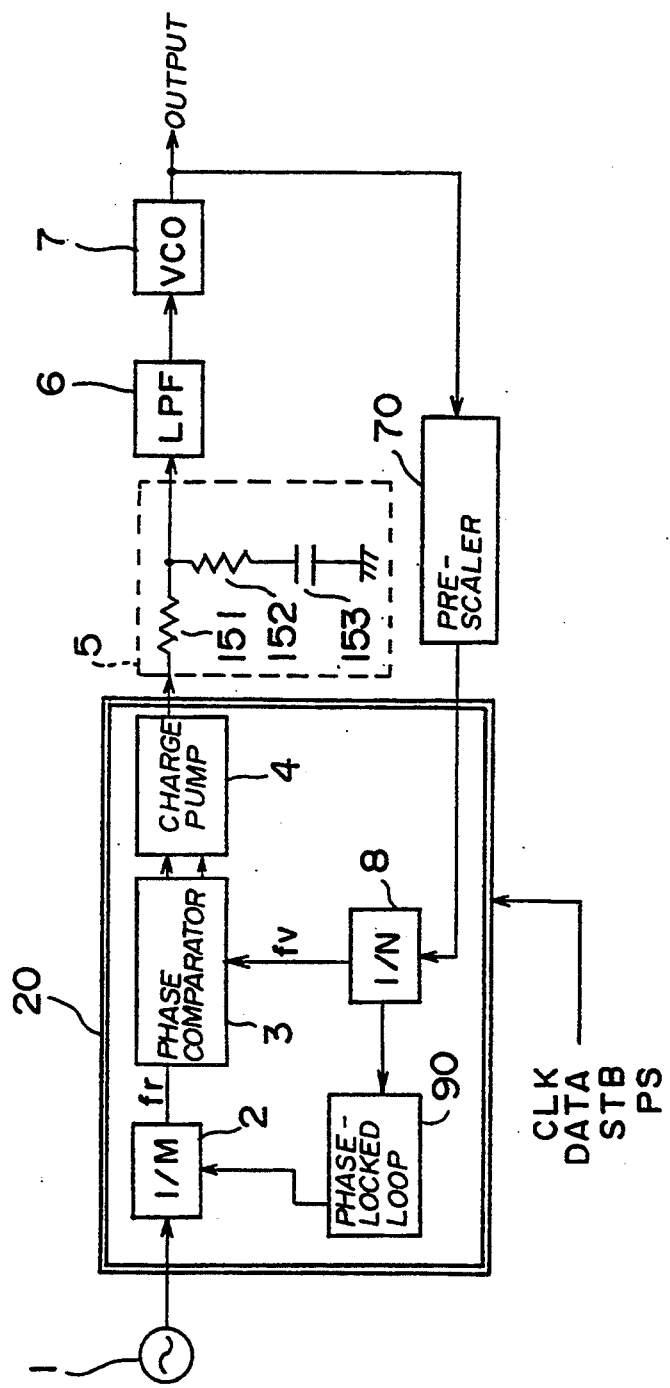
FIG. 1 is a block diagram illustrating the conventional frequency synthesizer.
Figure 3:
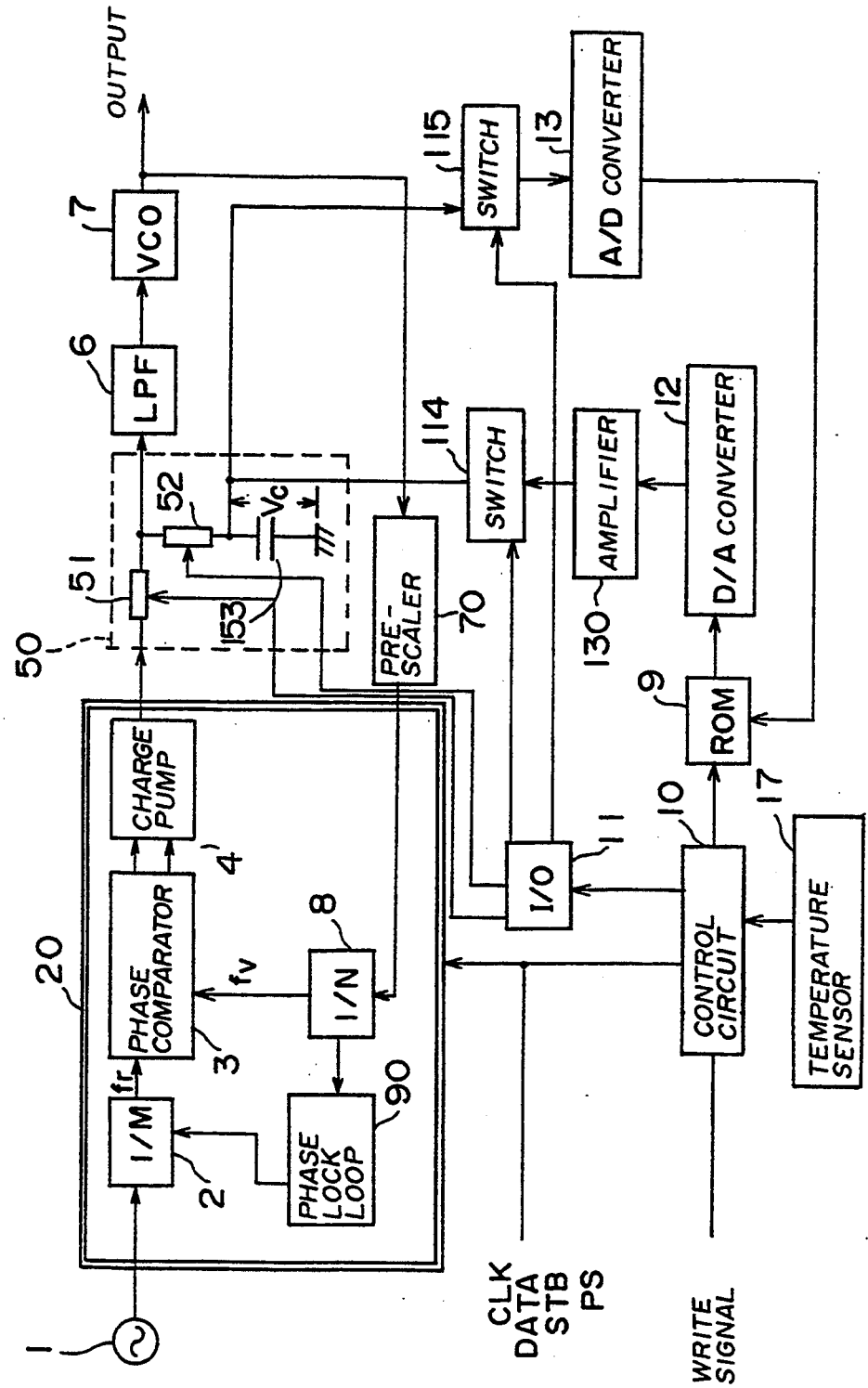
FIG. 3 is a block diagram illustrating the frequency synthesizer as the first embodiment of the present invention.

FIG. 3 shows the frequency synthesizer as the first embodiment of the present invention. This frequency synthesizer is used as a frequency source for an automobile telephone as in the earlier description, and is equipped with a power saving function. In the figure, the reference oscillator 1, the reference divider 2, the phase comparator 3, the charge pump 4, the low-pass filter 6, the voltage-controlled oscillator 7, the prescaler 70, the comparison divider 8, and the forced phase-locked loop 90 are the same as those described along with the conventional synthesizer shown in FIG. 1.

One difference from the conventional art is that the frequency synthesizer shown in FIG. 3 comprises: a control circuit 10, a ROM 9, an I/O port 11, a D/A converter 12, an amplifier 130, switches 114, 115, an A/D converter 13, a temperature sensor 17, and the loop filter portion 50. The loop filter portion 50 is provided with a capacitor 153 and variable resistors 51 and 52. The control circuit 10 is fed with inputs of a clock CLK, data DATA, a strobe signal STB, and a power saving signal PS as well as a temperature level detected by the temperature sensor 17. On the basis of these, the control circuit modifies and controls the time constant of the loop filter portion 50, effects ON/OFF control of the switches 114, 115, and carries out addressing arrangement of the ROM 9. Modification and control of the time constant of the loop filter portion 50 will be described later.

The ROM 9 is embodied by, for example, a rewrite-enabled EEPROM. This ROM 9 stores, in a table format, a terminal voltage value Vc (serving, in effect, as a control voltage of the voltage-controlled oscillator 7) of the capacitor 153 of the loop filter portion 50, which voltage level is measured when the loop portion is outputting a frequency corresponding to output frequencies presettable in this frequency synthesizer. The setting of this table will be described in detail later.

The terminal voltage data read from this ROM 9 is converted to an analog signal by means of the D/A converter 12, and is applied to a terminal of the capacitor 153 of the loop filter portion 50 via the amplifier 130 and the switch 114, which is turned ON. The terminal of the capacitor 153 is connected to the A/D converter 13 via the switch 115, thus enabling the terminal voltage value Vc of the capacitor 153 to be converted to a digital signal. The output signal from this A/D converter 13 is fed to the input of the ROM 9 as write data.

Figure 5:
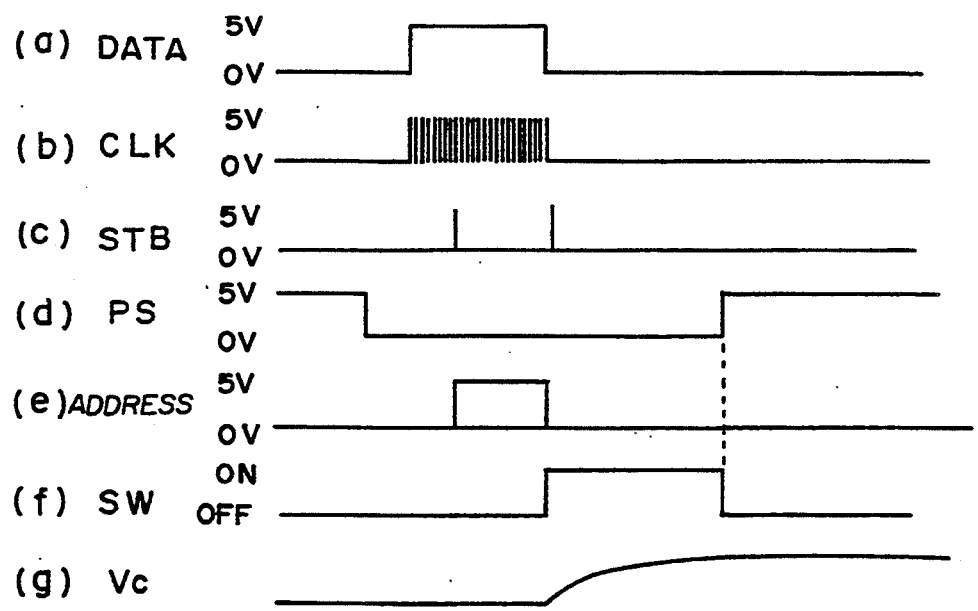
FIG. 5 is a time chart showing signals at various portions of the frequency synthesizer of FIG. 3.

The operation of the frequency synthesizer shown in FIG. 3 will be described below with reference to FIG. 5. FIG. 5 is a time chart of signals measured at various portions of the frequency synthesizer shown in FIG. 3, where (a) is data DATA, (b) is a clock CLK, (c) is a strobe signal STB, (d) is a power saving signal PS, (e) is an address signal input to the ROM 9, (f) is a switch signal SW for controlling a switch for modifying the time constant of the loop filter portion 50, and for effecting ON/OFF control of the switch 114, and (g) is the terminal voltage value Vc of the capacitor 153 in the loop filter portion 50.

The basic operation of the frequency synthesizer shown in FIG. 3 is the same as that of the conventional synthesizer. That is, the data DATA input to the IC circuit 20 allows the dividing ratio of the reference divider 2 and the comparison divider 8 to be set so that the frequency synthesizer may output the desired frequency. The output signal output from the reference oscillator 1 is divided into the reference signal $f_r$ by the reference divider 2 and is fed to one input of the phase comparator 3; and the output signal output from the voltage-controlled oscillator 7 is divided to produce the comparison signal $f_v$ by the comparison divider 8, and is fed to the other input of the phase comparator 3. The phase comparator 3 effects phase comparison of the two input signals, and drives the charge pump 4 in accordance with the phase difference between the two input signals, thereby charging or discharging the capacitor 153 of the loop filter portion 50. The output signal output from the loop filter portion 50 is fed to the voltage-controlled oscillator 7 as the control voltage so that the phase-locked loop is formed for achieving phase lock-in and frequency lock-in.

Consider an operation in which the frequency is switched to a different value. When this switching is effected, a power saving signal PS is fed to the input of the IC circuit 20, thus putting the frequency synthesizer into a power saving mode. Thereafter, a clock CLK, data DATA, and a strobe signal STB are applied to the input of the same circuit; and, on the basis of the data DATA, a dividing ratio is set in the reference divider 2 and the comparison divider 8, in correspondence to the new frequency to be set.

The clock CLK, the data DATA, and the strobe signal STB are also fed to the input of the control circuit 10. Using these signals, the control circuit 10 specifies addresses in the ROM 9 so that the data indicating the terminal voltage value Vc of the capacitor 153 of the loop filter portion 50 may be read from the ROM 9, which value corresponds to the new frequency to be set in the frequency synthesizer. This data indicating the terminal voltage value has undergone correction in accordance with the temperature data from the temperature sensor 17.

Thus, the data corresponding to the target frequency is read from the ROM 9; and this data is converted to an analog value by the D/A converter 12 and is fed to the input of the switch 114 via the amplifier 130. This switch 114 is turned ON at an appropriate timing during the period of the power saving mode, by means of a switch signal SW supplied from the control circuit 10. With the switch 114 turned ON, the data read from the ROM 9 and converted to an analog value is applied to the terminal of the capacitor 153 of the loop filter portion 50 via the switch 114. As a result of this, charging or discharging of the capacitor 153 of the loop filter portion 50 is performed as appropriate so that the terminal voltage value of the capacitor may be made to correspond to the value corresponding to the data read from the ROM 9. This value is the terminal voltage value of the capacitor 153 when the frequency synthesizer is stabilized at the target frequency (in other words, the control voltage of the voltage-controlled oscillator 7).

When the power saving signal PS is turned OFF, cancelling the power saving mode, the switch 114 is turned OFF, thereby disconnecting the capacitor 153 from the circuit to which the switch 114 belongs. Normal operation is then initiated to achieve frequency lock-in and phase lock-in with the target frequency.

The time required for frequency locking is extremely short and the frequency switching is achieved quickly in the circuit of this embodiment because the capacitor 153 of the loop filter portion 50 is charged, when power saving mode is still in effect, to the control voltage of the voltage-controlled oscillator 7 so as to set the target frequency, thus locking the frequency of the voltage-controlled oscillator 7, the power saving mode being cancelled only after this, and because the forced phase-locked loop 90 in the IC circuit 20 effects phase lock-in immediately after the cancellation.

In the circuit of this embodiment, error in the voltage value set for the capacitor 153, which error arises from the variation in ambient temperature, is reduced because the ambient temperature is measured by the temperature sensor 17, and the terminal voltage value set for the capacitor 153 of the loop filter portion 50 is controlled in accordance with the ambient temperature.

The configuration of the switch 114 of the circuit in the embodiment has many variations including the one depicted in FIG. 4A. This circuit is configured such that there is provided an FET, and the FET is turned ON, when the frequency is raised, so as to charge the capacitor 153 of the loop filter portion 50, and, when the frequency is lowered, an FET 2 is turned ON so as to discharge the capacitor 153 of the loop filter portion 50, and, when frequency switching is not required, both the FET 1 and the FET 2 are turned OFF so as not to affect the phase-locked loop. Another variation shown in FIG. 4B is configured such that two switching elements are employed; a switch 4 is turned ON, when effecting frequency switching, so as to discharge the capacitor 153 of the loop filter portion 50, and then turned OFF, or a switch 3 is turned ON so as to charge the capacitor 153 of the loop filter portion 50 with a predetermined voltage, and, when frequency switching is not effected, both switches are turned OFF so as not to affect the phase-locked loop.

A description will now be given of the data table setting of the ROM 9 in the circuit of the described embodiment. This setting is performed, for example, prior to shipping a product.

First, power is turned on, and a write signal is applied to the control circuit 10, whereupon the control circuit 10 puts the ROM 9 into a write-enabled mode as well as turning the switch 115 ON. Providing that there are 1000 frequency channels, the channels ranging from the first channel to the thousandth are set, for example, in four-channel units. The control voltage of the loop filter portion 50 at each frequency (in other words, the terminal voltage of the capacitor 153) is fed to the input of the A/D converter 13 via the switch 115, by which converter the voltage is converted to a digital control voltage data; and this control voltage data is written into the ROM 9. This control voltage data is written into an address corresponding to the frequency which is output then. Thus, the data are written into the ROM 9 automatically.

By varying ambient temperature, the above data write process is executed for various temperature levels, so that the ROM table covering a range of temperatures is completed. As described before, while the frequency synthesizer is in operation, ambient temperature is detected by the temperature sensor 17, and the setting of the control voltage is done by referring to the ROM table corresponding to that particular temperature.

When the write process is completed, the control circuit 10 turns the switch 115 OFF so as not to affect the phase-locked loop, and returns the ROM 9 to a read mode.

Various embodiments of the present invention are possible. For example, in the first embodiment above, the ROM 9 is provided with a circuit (composed of the switch 115, the A/D converter 13, etc.) for automatically setting the control voltage data and this circuit is utilized in setting the data. The present invention is not limited to this configuration, of course, and the automatic setting circuit can be left out. Instead, a chart showing correspondences between the output frequencies and the control voltage values can be prepared by conducting experiments beforehand, after which the data write operation of the ROM 9 can be carried out in accordance with this correspondence chart. However, more accurate control is possible in the described embodiment than in the configuration just mentioned because, in the described embodiment, variations of circuit constants of the voltage-controlled oscillator 7 and the loop filter portion 50 are taken into account by measuring the actual control voltage of the loop filter portion 50, in correspondence to the output frequency of the frequency synthesizer.

While the above embodiment enables temperature compensation to be effected by the temperature sensor 17 so as to suppress the effect of ambient temperature, it is of course possible to embody the present invention without temperature compensation.

Figure 6:
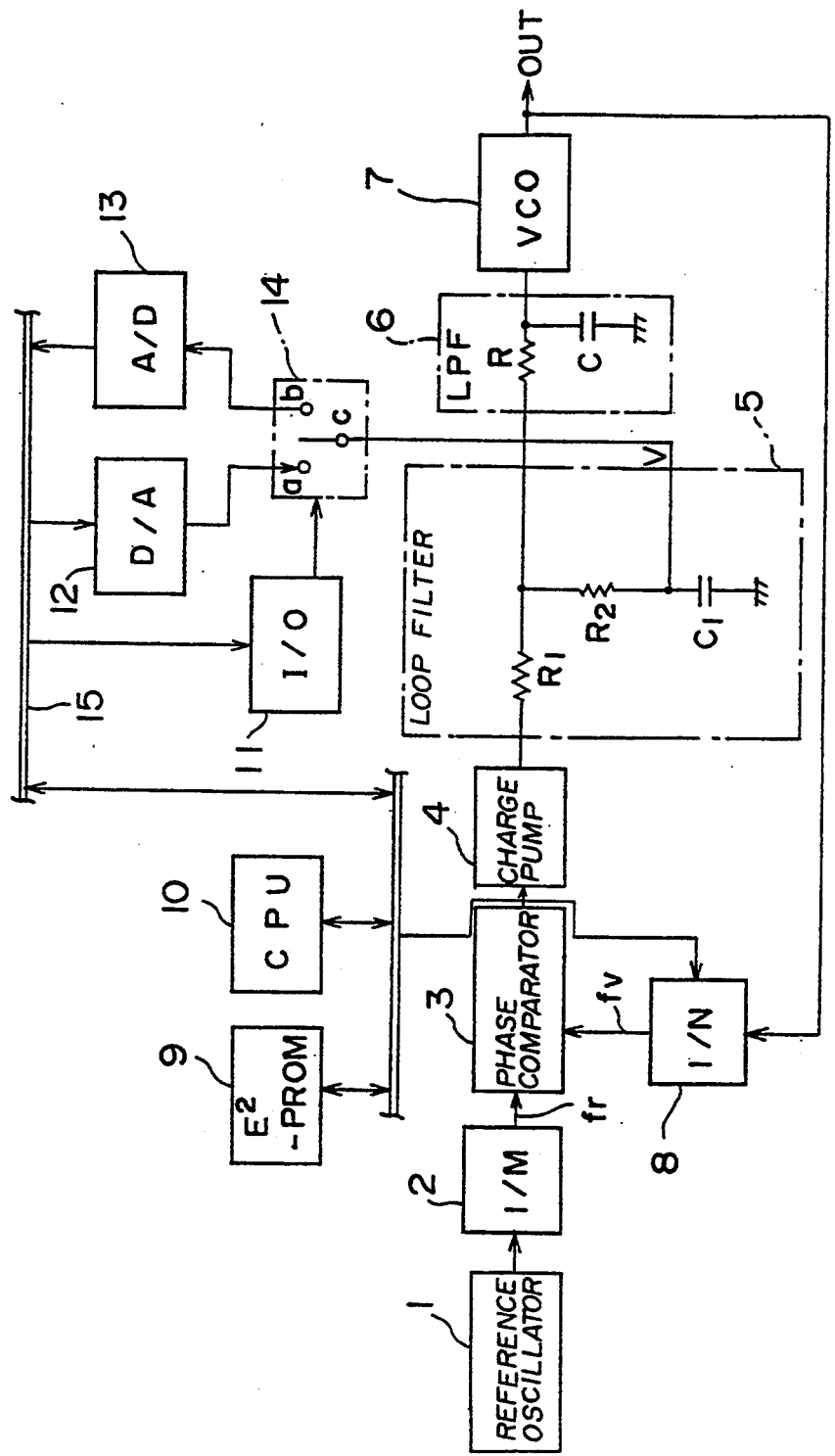
FIG. 6 is a block diagram of the frequency synthesizer of a preset type.

FIG. 6 is a block diagram illustrating the frequency synthesizer of a preset type, in which a preset circuit 5 quickly charges and discharges the capacitor of the loop filter so as to switch the oscillating frequency of the voltage-controlled oscillating circuit at a high speed. In the figure, 1 indicates a reference oscillator, 2 a 1/M divider, 3 a phase comparator, 4 a charge pump, 5 a loop filter of a lag/lead type, 6 a low-pass filter (LPF), 7 a voltage-controlled oscillating circuit (VCO), 8 a 1/N variable divider, 9 a rewrite-enabled ROM ($E^2PROM$), 10 a CPU, 11 an I/O port, 12 a D/A converter, 13 an A/D converter, 14 a switching circuit, and 15 the common bus of the CPU 10.

Prior to shipping such a frequency synthesizer of a preset type, preset voltages $V_1$-$V_n$ for all the channels are written into the ROM 9. The CPU 10 switches the switching circuit 14 to the "b" position to that the control voltage of a capacitor $C_1$ may be read, and in this condition sets, in the variable divider 8, a dividing number $N_1$ corresponding to channel 1 so as to cause, by means of the PLL, a corresponding frequency $f_1$ to be generated by the VCO 7, the CPU then reading the control voltage $V_1$ when phase lock-in is obtained and writing the control voltage into the ROM 9. The same process is true of the other channels.

When operating such a frequency synthesizer of a preset type, the CPU 10 reads, in response to the specification of channel i by a base station, the corresponding dividing number $N_i$ from the ROM 9, then sets the number in the variable divider 8, reading a corresponding preset voltage $V_i$ from the ROM 9, and setting the voltage in the D/A converter 12. Then the CPU switches the switching circuit 14 to the "a" position for a predetermined period of time so as to quickly charge or discharge the capacitor $C_1$ until it is charged to the preset voltage $V_i$, thus switching the oscillating frequency of the VCO 7 to the frequency $f_i$ for the specified channel i at a high speed.

While the oscillating frequency of the VCO 7 may be switched to $f_i$ at a high speed through the above process, the reference frequency $f_r$ and the comparison frequency $f_v$ are not phase-locked with each other at this stage. For phase-locking to be effected, a continued process of phase pull-in by means of the PLL is necessary. Instability of the oscillating frequency $f_i$ of the VCO 7 during this pull-in period causes the speed at which frequencies are switched in the synthesizer of a preset type shown in FIG. 6, to be substantially restricted. This point will be described below in detail.

Figure 7A:
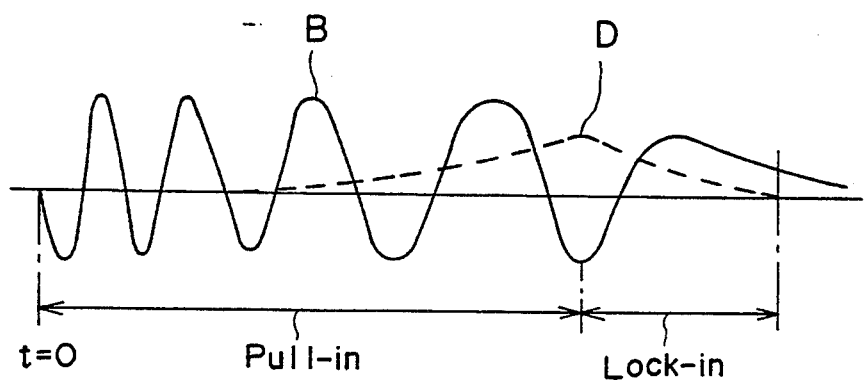
FIG. 7A and 7B describe the operational characteristics of the frequency synthesizer of a preset type shown in FIG. 6.

The operational characteristics of the frequency synthesizer of a preset type shown in FIG. 6 will be described now, with reference to FIGS. 7A and 7B. FIG. 7A is a time chart for the period between frequency pull-in and phase lock-in; and FIG. 7B shows characteristics of the amplitude A and the phase P of the PLL signal.

In FIG. 7A, when the above frequency switching operation is carried out at t=0, the comparison frequency $f_v$ of the phase comparator 3 is temporarily disturbed, with the result that a beat signal B, corresponding to a difference frequency derived from the difference between the comparison frequency $f_v$ and the reference frequency $f_r$, is generated in the output of the phase comparator 3. In response to this, the PLL acts such that, on the positive half-cycle of the beat signal B, the oscillating frequency $f_i$ of the VCO 7 is brought close to the reference frequency $f_r$, and the same frequencies are brought apart on the negative half-cycle. This causes the waveform of the beat signal to change such that the variation is dull on the positive half-cycle due to the decreased frequency difference, while the variation is sharp on the negative half-cycle due to the increased frequency difference. As a result of this, the DC component level D of the beat signal is shifted to the positive side, which DC component D acts to effect the frequency pull-in. When the frequency difference comes into a range where the follow-up capability of the PLL is effective, a phase lock-in is achieved within one cycle from that moment. Accordingly, the higher the gain with respect to the DC component D, the better the frequency pull-in characteristic of the PLL.

Figure 7B:
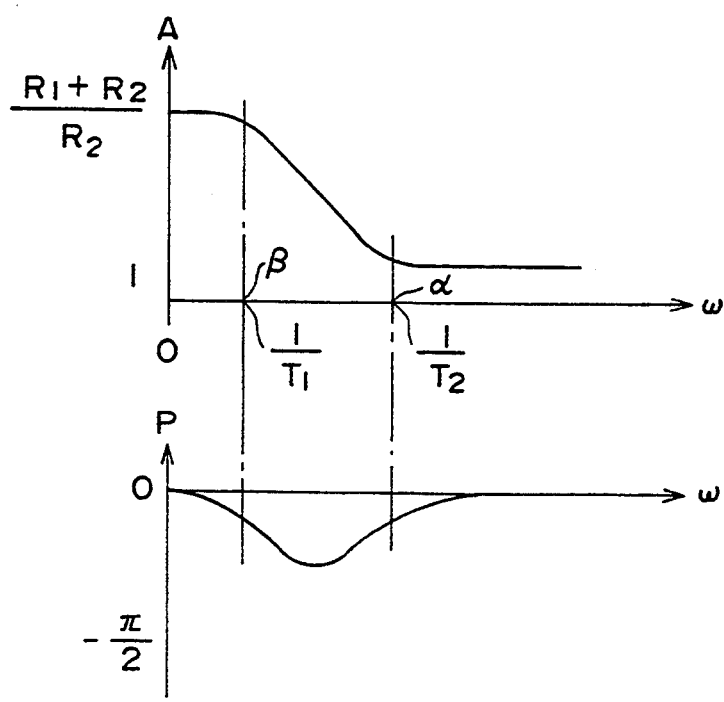

In FIG. 7B, the transfer characteristic of the loop filter 5 is expressed as $$F(S) = G \cdot (S+\alpha)/(S+\beta),$$

where $$G = R_2/(R_1+R_2)$$

$$\alpha = 1/R_2 C$$

$$\alpha = 1/(R_1+R_2)C.$$

$\beta$, $\alpha$ are corner angular frequencies, which are represented, by using the time constants $T_1 = (R_1+R_2)C$, $T_2 = R_2 C$ of the loop filter 5, as $\beta = 1/T_1$, $\alpha = 1/T_2$.

Supposing that a gain $(R_1+R_2)/R_2$ is added outside of the loop filter 5, the PLL loop as a whole yields a gain characteristic A of $F(0) = (R_1+R_2)/R_2$, $F(\infty) = 1$. Therefore, the greater $R_1$, the larger the gain $F(0)$ with respect to the DC component D. However, the corner angular frequency $\beta$ determining the response speed of the PLL loop is $1/(R_1+R_2)C = 1/T_1$, and becomes smaller, that is, the response of the PLL becomes slower, as $R_1$ gets greater. Accordingly, a compromise must be made between the gain and the corner angular frequency.

In the synthesizer of a preset type shown in FIG. 6, the gain with respect to the DC component D is secured with the result that the corner angular frequency $\beta$, which is a factor determining the transfer characteristic, becomes lower. Therefore, a fairly long time is needed from when the frequency switching operation is initiated until the actual phase lock-in is accomplished.

A description will be given below of the synthesizer of a preset type as the second embodiment of the present invention.

Figure 8:
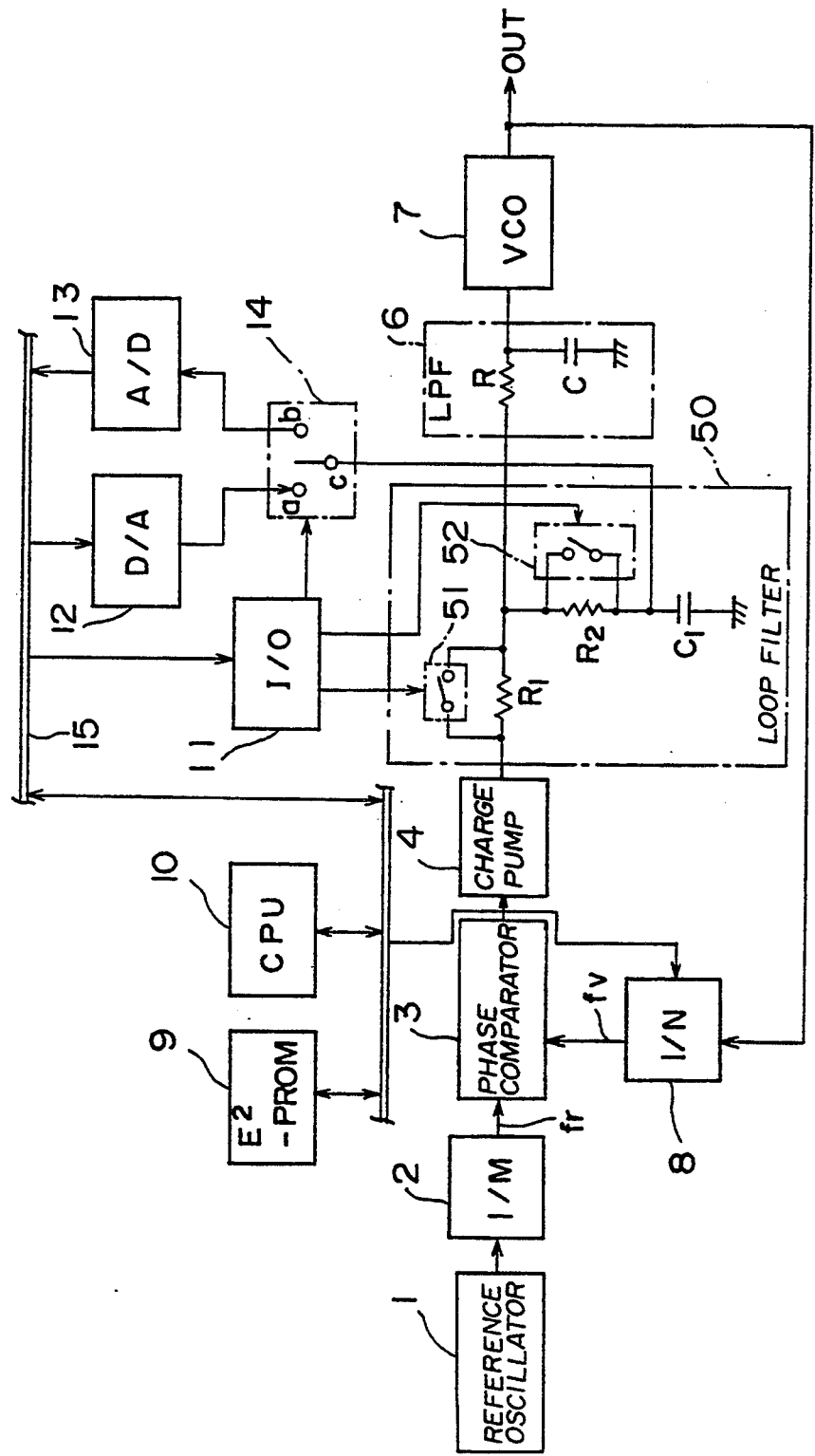
FIG. 8 is a block diagram of the frequency synthesizer of a preset type as the second embodiment of the present invention.

FIG. 8 is a block diagram of the frequency synthesizer of a preset type as the second embodiment. In the figure, like reference numerals to those in FIG. 6 indicate the same or like parts. 50 indicates the loop filter and 51, 52 indicate switching circuits.

In the frequency synthesizer as the second embodiment, the preset circuit 60 is composed of the CPU 10, the ROM 9, the switching circuit 14 and the D/A converter 12; and the modifying circuit 70 is composed of the CPU 10 and the switching circuits 51, 52.

While the switching circuits 51, 52 of FIG. 8 are provided so as to short-circuit the resistors $R_1$, $R_2$ respectively, they are not totally short-circuited. Any configuration is acceptable as long as the values of resistance of the resistors $R_1$, $R_2$ are made smaller.

When operating the frequency synthesizer of a preset type as the second embodiment, the CPU i 10 reads, in response to the specification of channel i by a base station, the corresponding dividing number $N_i$ from the ROM 9, then sets the number in the variable divider 8, reading the corresponding preset voltage $V_i$ from the ROM 9, and setting the voltage in the D/A converter 12. Further, the CPU switches the switching circuit 14 to "a" position for a predetermined period of time so as to quickly charge or discharge the capacitor $C_1$ until it is charged to the preset voltage $V_i$, thus switching the oscillating frequency of the VCO 7 to the frequency $f_i$ for the specified channel i at a high speed.

The CPU 10 speeds up the response of the PLL and reduces the time required for frequency pull-in and phase lock-in, by decreasing the time constant of the loop filter 50 for a predetermined period of time using switching control whereby the switching circuits 51, 52 are turned ON for a predetermined period of time. After that period of time, the time constant of the loop filter 50 is returned to its previous value, recovering the normal PLL response characteristics.

A description will be given next of the operational characteristics of the frequency synthesizer as the second embodiment of the present invention, with reference to FIGS. 9A, 9B. FIG. 9A is a time chart for the period between frequency pull-in and phase lock-in; and FIG. 9B shows the amplitude A and the phase P of the PLL signal.

Referring to FIG. 9B, supposing that the values of resistance of the resistors $R_1$, $R_2$ become $R_1'=R_1/K$, $R_2'=R_2/K$ respectively as a result of the CPU 10 controlling the switching circuits 51, 52, the transfer characteristic of the loop filter 50 is expressed as $$F(S)=G \cdot (S+\gamma)/(S+\delta),$$

where $$G=R_2'/(R_1'+R_2')=R_2/(R_1+R_2)$$

$$\gamma=1/R_2'C=K/R_2C$$

$$\delta=1/(R_1'+R_2')C=K/(R_1+R_2)C$$

$\delta$, $\gamma$ are corner angular frequencies, and are K times that of the corner angular frequencies $\alpha$, $\beta$ effective before the switching circuits 51, 52 are controlled. In terms of the time constants, $T_3=(R_1'+R_2')C$, $T_4=R_2'C$, which are 1/K times that of the time constants $T_1$ and $T_2$ respectively. Accordingly, the response of the PLL is quick during this time period, and therefore the time required for frequency pull-in and phase lock-in is reduced.

Even when the values of resistance of the resistors $R_1$, $R_2$ of the loop filter 50 are controlled to be 1/K of the original values, the gain $(R_1+R_2)/R_2$ added outside of the loop filter 50 remains unchanged. Accordingly, the PLL as a whole yields a gain characteristic A of $F(0)=(R_1+R_2)/R_2$, $F(\infty)=1$, and the gain with respect to the DC component D remains the same as before the time constant of the loop filter 50 is controlled.

Referring to FIG. 9A, as a result of the PLL response being made quicker, the lock-in process is facilitated even when the frequency of the beat signal B is high. Accordingly, the time, from when the frequency switching operation is initiated until the actual phase lock-in is accomplished, is greatly reduced.

Although, in the above-described second embodiment, both values of resistance of the resistors are 1/K times those of $R_1$ and $R_2$ respectively, this is not the only configuration. A sufficient effect is achieved when only the value of resistance of the resistor $R_1$ or the value of resistance of the resistor $R_2$ is made smaller.

Although the description of the second embodiment above assumes the use of loop filters 5 and 50 of a lag/lead type, other kinds of loop filters, where $R_2=0$, can be utilized in the same manner.

As has been described, the second embodiment above enables great reduction of the time required from when the frequency switching operation is initiated until the actual phase-lock is established, because the time constant of the loop filter is made small when switching the frequency, and because, consequently, the response of the PLL is made quicker.

POSSIBLE APPLICATION IN INDUSTRY

The frequency synthesizer of the this invention can be utilized as a frequency source for mobile telephone equipment such as an automobile telephone or a portable telephone, and is capable of high-speed continuous switching of the output frequency in correspondence to the channel specification issued from a base station.

We claim:

1. A frequency synthesizer including a phase lock loop for conducting, using a phase comparator, a phase comparison of a comparison signal based on an output of a voltage-controlled oscillator with a reference signal based on an output of a reference oscillator, and for submitting a phase difference signal derived from the comparison to a loop filter whose output serves as a control signal of said voltage-controlled oscillator, the frequency synthesizer comprising:

a preset circuit provided for quickly charging and discharging a capacitor of said loop filter so that the output frequency of said voltage-controlled oscillator may be switched; and a modifying circuit for modifying a time constant of said loop filter, said phase lock loop being quickly brought into phase lock-in by reducing the time constant of said loop filter when switching said output frequency;

wherein the control signal to be input to said voltage-controlled oscillator is set, when switching the output frequency of said voltage-controlled oscillator, to charge or discharge, by means of said preset circuit, said capacitor of said loop filter; and wherein said preset circuit comprises a control portion, a storage portion, a D/A converter and a switch, said storage portion storing data relating to the value of the control signal of said voltage-controlled oscillator, which data corresponds to an output frequency synthesized by the frequency synthesizer, and said control portion connecting, by a switching operation, said storage portion to the terminal of the capacitor of said loop filter via the D/A converter, when switching said output frequency.

2. The frequency synthesizer as claimed in claim 1, wherein said preset circuit further comprises a temperature sensor for detecting ambient temperature, said storage portion storing, for each temperature level, data relating to the control signal of the voltage-controlled oscillator, said data corresponding to an output frequency synthesized by the frequency synthesizer, and said preset circuit being configured such that data valid for the temperature level detected by said temperature sensor is read from said storage portion when the output frequency of the frequency synthesizer is switched.

3. The frequency synthesizer as claimed in claim 1, wherein said control portion is configured to convert the terminal voltage of the capacitor of said loop filter to a digital signal using an A/D converter, by turning the switch of said preset circuit ON while a write signal is input to the control portion, the control portion then writing the value of said digital signal into said storage portion.

4. A frequency synthesizer including a phase lock loop in which a phase difference signal based on a phase comparison between a compared signal based on an output signal of a voltage-controlled oscillator and a reference signal based on an output signal of a reference oscillator is passed through a loop filter and is then applied, as a control signal, to the voltage controlled oscillator, said frequency synthesizer comprising:

preset circuit means for changing an output frequency of the voltage controlled oscillator; and modifying means for changing a time constant of said loop filter so that said time constant is reduced when switching the output frequency of the voltage controlled oscillator, said preset circuit means comprising:

storage means for storing data relating to values of the control signal applied to the voltage controlled oscillator, said values corresponding to output frequencies that can be synthesized by the frequency synthesizer; and control means for reading data related to one of the output frequencies to be switched from the storage means and controlling said loop filter on the basis of said data read from the storage means.

5. The frequency synthesizer as claimed in claim 4, wherein said modifying means comprises a control portion and switching circuits, and said loop filter comprises a resistor, said control portion decreasing, when switching the output frequency of the frequency synthesizer, the time constant of said loop filter for a predetermined period of time, by controlling said resistor.

6. The frequency synthesizer as claimed in claim 4, wherein said preset circuit means further comprises a temperature sensor for detecting ambient temperature, said storage means storing, for each temperature level, data relating to the control signal of the voltage-controlled oscillator, said data corresponding to an output frequency synthesized by the frequency synthesizer, and said preset circuit means being configured such that data valid for the temperature level detected by said temperature sensor is read from said storage means when the output frequency of the frequency synthesizer is switched.

7. The frequency synthesizer as claimed in claim 4, wherein said preset circuit means quickly charge and discharge a capacitor of said loop filter to change an output frequency of the voltage controlled oscillator.

8. The frequency synthesizer as claimed in claim 7 wherein:

said control means convert a terminal voltage of the capacitor.

9. The frequency synthesizer as claimed in claim 8 wherein:

said preset circuit includes a D/A converter and a switch.

* * * * *

UNITED STATES PATENT AND TRADEMARK OFFICE
CERTIFICATE OF CORRECTION

PATENT NO. : 5,389,899
DATED : February 14, 1995
INVENTOR(S) : Yahagi et al.

It is certified that error appears in the above-indentified patent and that said Letters Patent is hereby corrected as shown below:

Column 1, line 23, delete "1" and insert --1, 1--.

Column 7, line 20, delete "to" and insert --so--.

Column 8, line 28, delete "α" and insert --β--.

Signed and Sealed this

Twenty-eighth Day of November 1995

Attest:

BRUCE LEHMAN

Attesting Officer     Commissioner of Patents and Trademarks